(12) United States Patent
Maruyama

(10) Patent No.: US 11,302,612 B2
(45) Date of Patent: Apr. 12, 2022

(54) LEAD FRAME WIRING STRUCTURE AND SEMICONDUCTOR MODULE

(71) Applicant: FUJI ELECTRIC CO., LTD., Kawasaki (JP)

(72) Inventor: Ryo Maruyama, Kawasaki (JP)

(73) Assignee: FUJI ELECTRIC CO., LTD., Kawasaki (JP)

(*) Notice: Subject to any disclaimer, the term of this patent is extended or adjusted under 35 U.S.C. 154(b) by 0 days.

(21) Appl. No.: 17/085,758

(22) Filed: Oct. 30, 2020

(65) Prior Publication Data
US 2021/0050286 A1 Feb. 18, 2021

Related U.S. Application Data

(63) Continuation of application No. PCT/JP2019/040010, filed on Oct. 10, 2019.

(30) Foreign Application Priority Data

Nov. 5, 2018 (JP) .............................. JP2018-208087

(51) Int. Cl.
| H01L 23/495 | (2006.01) |
|---|---|
| H01L 23/498 | (2006.01) |
| H01L 23/00 | (2006.01) |
| H01L 25/18 | (2006.01) |

(52) U.S. Cl.
CPC .. *H01L 23/49555* (2013.01); *H01L 23/49838* (2013.01); *H01L 24/37* (2013.01); *H01L 24/40* (2013.01); *H01L 25/18* (2013.01); *H01L 2224/32221* (2013.01);
(Continued)

(58) Field of Classification Search
None
See application file for complete search history.

(56) References Cited

U.S. PATENT DOCUMENTS 9,496,208 B1* 11/2016 Ostrowicki ....... H01L 23/49562
2007/0138624 A1 6/2007 Sudo et al.
(Continued)

FOREIGN PATENT DOCUMENTS

| JP | H01-153648 U | 10/1989 |
|---|---|---|
| JP | H02-5558 A | 1/1990 |

(Continued)

*Primary Examiner* — Hung K Vu
(74) *Attorney, Agent, or Firm* — Rabin & Berdo, P.C.

(57) ABSTRACT

A lead frame wiring structure including first and second bonding parts positioned apart from each other, and a coupling part extending in a first direction to couple the first and second bonding parts. The coupling part includes a coupling face section, and first and second leg sections extending respectively from two opposite end portions of the coupling face section toward the first and second bonding parts. The first bonding part includes a wide section having a side edge portion and a peripheral section adjacent to the side edge portion in a second direction, and a narrow section protruding in the first direction from the side edge portion. In the coupling part, the coupling face section is spaced apart from the two bonding parts in a third direction, and the first leg section is connected to the peripheral section of the first bonding part. The first to third directions are perpendicular to one another.

7 Claims, 8 Drawing Sheets

(52) U.S. Cl.
CPC .............. *H01L 2224/40225* (2013.01); *H01L 2224/48091* (2013.01); *H01L 2224/73265* (2013.01)

(56) References Cited

U.S. PATENT DOCUMENTS

| | | | |
|---|---|---|---|
| 2013/0082334 A1* | 4/2013 | Nakamura | H01L 27/088 257/401 |
| 2014/0117523 A1* | 5/2014 | Ho | H01L 23/4952 257/676 |
| 2018/0076149 A1 | 3/2018 | Asai | |

FOREIGN PATENT DOCUMENTS

| | | |
|---|---|---|
| JP | H09-116080 A | 5/1997 |
| JP | 2000-124398 A | 4/2000 |
| JP | 2004-228461 A | 8/2004 |
| JP | 2007-173272 A | 7/2007 |
| JP | 2012-238684 A | 12/2012 |
| JP | 2015006017 A | 1/2015 |
| JP | 2015-207675 A | 11/2015 |
| JP | 2018-046164 A | 3/2018 |

\* cited by examiner

LEAD FRAME WIRING STRUCTURE AND SEMICONDUCTOR MODULE

CROSS-REFERENCE TO RELATED APPLICATIONS

This application is a continuation application of PCT/JP2019/040010, filed on Oct. 10, 2019, which is in turn based upon and claims the benefit of priority to the Japanese Patent Application No. 2018-208087, filed on Nov. 5, 2018. The entire contents of these applications are incorporated herein by reference.

TECHNICAL FIELD

The present invention relates to a lead frame wiring structure and a semiconductor module.

BACKGROUND ART

A semiconductor module is provided with a semiconductor element such as an insulated gate bipolar transistor (IGBT), a power metal oxide semiconductor field effect transistor (power MOSFET), or a free wheeling diode (FWD) and used for, for example, a motor drive control inverter for an elevator or the like in the industrial application. In recent years, semiconductor modules have also been widely used for vehicle-mounted-motor drive control inverters. Vehicle-mounted-motor drive control inverters have been required to be reduced in size and weight to improve fuel efficiency and attain a long-term reliability under high-temperature operating environment so as to allow for placement in an engine room.

To meet the requirements of reduction in size and weight and attainment of a long-term reliability under high-temperature operating environment, a semiconductor module has conventionally been proposed wherein a semiconductor chip (semiconductor element) and an electrode pattern are connected using a lead frame wiring scheme (see, for example, patent document 1). In the lead frame wiring scheme, a semiconductor chip is fixed in a supported manner and connected to an electrode pattern by using lead frame wiring obtained by molding a metal plate.

PRIOR ART DOCUMENT

Patent Document

Patent Document 1: Japanese Laid-open Patent Publication No. 2018-46164

SUMMARY OF THE INVENTION

Problems to be Solved by the Invention

As a general rule, two ends of the above-described lead frame wiring are each provided with an L-shaped bent section, and the horizontal lower face of the bent section is soldered to the upper surface of a semiconductor chip or electrode pattern. In soldering to a semiconductor chip or the like, solder could rise onto the drooping face portion of the bent section. The rise of solder onto the horizontal lower face portion of the bent section could cause a stress (distortion) resulting from heat deformation to be concentrated on the upper surface of the semiconductor chip, thereby breaking the semiconductor chip.

The present invention was created in view of such facts, and an object of the invention is to provide a lead frame wiring structure and a semiconductor module that can reduce stress concentration on a semiconductor element.

Means for Solving Problems

A lead frame wiring structure in accordance with embodiments electrically connects a semiconductor element that is located on one side of lead frame wiring to an object to be connected to that is located on another side of the lead frame wiring, the lead frame wiring including a first bonding part soldered to the semiconductor element, a second bonding part positioned spaced apart from the first bonding part and soldered to the object, and a coupling part coupling the first and second bonding parts, wherein the coupling part includes a coupling face section positioned spaced apart from the first and second bonding parts in an up-down direction, a first leg section extending from an end portion of the coupling face section on the one side toward the first bonding part, and a second leg section extending from an end portion of the coupling face section on the other side toward the second bonding part, and the first leg section is connected to a portion of a peripheral section of the first bonding part that is located between an end portion of the first bonding part on the one side and an end portion thereof on the other side.

Effect of the Invention

The present invention allows stress concentration on a semiconductor chip to be reduced.

DESCRIPTION OF EMBODIMENTS

Figure 10:
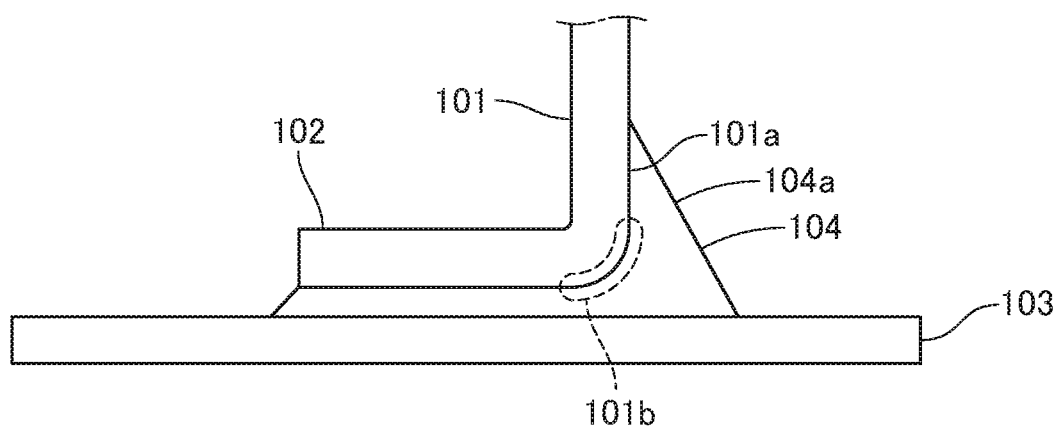
FIG. 10 is an enlarged schematic view of a portion of the conventional lead frame wiring that is bonded to a semiconductor element.

Known semiconductor modules used for vehicle-mounted-motor drive control inverters or the like adopt the lead frame wiring scheme wherein a semiconductor chip and an electrode pattern are connected by lead frame wiring so as to meet the requirements of reduction in size and weight and attainment of a long-term reliability under high-temperature operating environment. The configuration of the conventional lead frame wiring is described in the following by referring to FIG. 10. FIG. 10 is an enlarged schematic view of a portion of the conventional lead frame wiring that is bonded to a semiconductor element.

As a general rule, as depicted in FIG. 10, a portion of lead frame wiring that is connected to a semiconductor chip or the like includes, when seen in a side view, a drooping face section 101 extending essentially vertically and a horizontally extending horizontal face section 102 formed by bending the lead frame wiring into an L shape at an end portion of the drooping face section 101. The lower face of the horizontal face section 102 of the lead frame wiring is bonded to the upper surface of the semiconductor chip 103 by solder 104.

The portion of the solder 104 located under the horizontal face section 102 is pressed against, and evenly spread over, the lower face of the horizontal face section 102, thereby contributing to the bonding. By contrast, the portion of the solder 104 located under the drooping face section 101 could rise on a side face 101a of the drooping face section 101 that is located on the opposite side from the horizontal face section 102. The semiconductor chip 103 will repeatedly exhibit heat deformation in association with being repeatedly put in an energized state and a non-energized state. A large proportion of the solder 104 will be concentrated on a portion with a rising portion 104a of the solder 104 in comparison with the other portions, and thus a stress (distortion) resulting from heat deformation could be concentrated on the upper surface of the semiconductor chip 103, thereby breaking the semiconductor chip 103.

The inventor focused on the fact that an R-shaped portion 101b formed in association with the bending of the lead frame wiring is a cause of the solder rising phenomenon. The inventor found that reducing the surface area of the R-shaped portion 101b formed in association with the bending will suppress the solder rising phenomenon from occurring and contribute to a reduction in stress concentration on the semiconductor chip, thereby arriving at the present invention.

In particular, an essential feature of the present invention is a lead frame wiring structure including a first bonding part soldered to a semiconductor element located on one side of lead frame wiring, a second bonding part soldered to an object to be connected to that is located on another side of the lead frame wiring, and a coupling part coupling the first and second bonding parts, wherein the coupling part is provided with a leg section extending in an up-down direction and bonded to the first bonding part, and the leg section is connected to a portion of a peripheral section of the first bonding part that is located between the end portion of the first bonding part on the one side and the end portion thereof on the other side.

In the present invention, the leg section is connected to a portion of a peripheral section of the first bonding part that is located between the end portion of the first bonding part on the one side and the end portion thereof on the other side. Hence, the area of contact between the leg section and the solder for bonding the first bonding part to the semiconductor element can be reduced. Accordingly, when the leg section is formed by bending, the surface area of the R-shaped portion formed in association with the bending can be reduced so that the solder rising phenomenon can be suppressed from occurring, thereby reducing stress concentration on the semiconductor chip.

Figure 1:
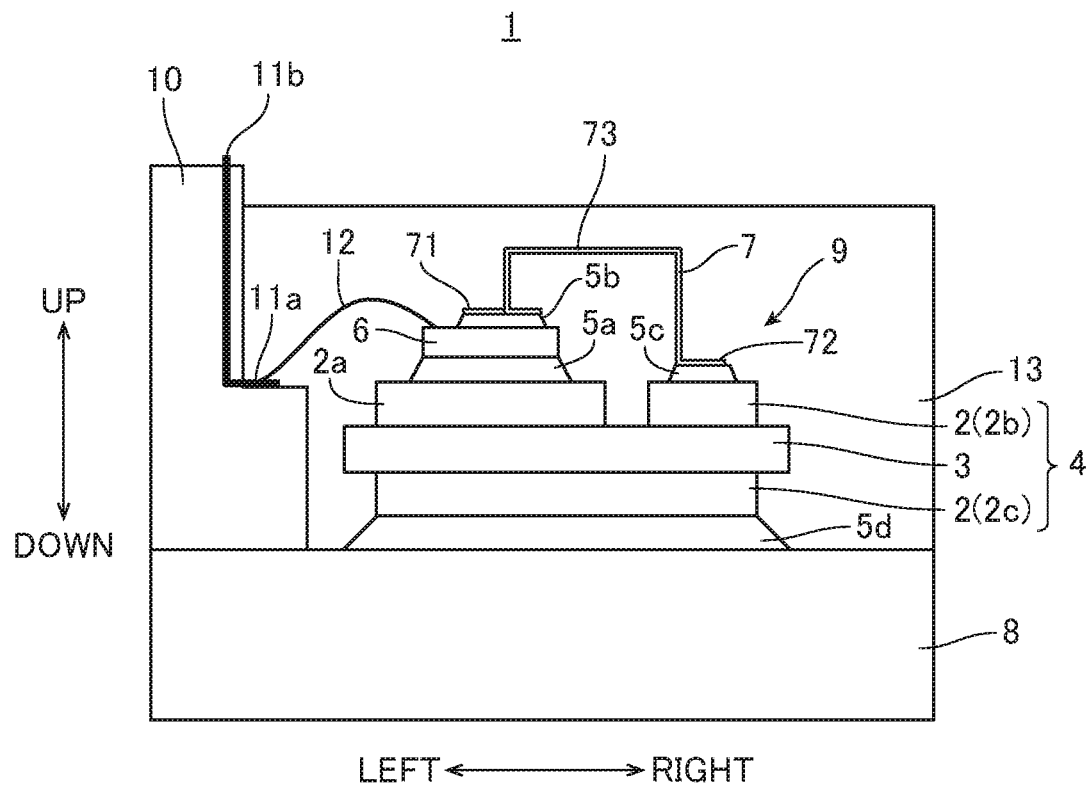
FIG. 1 is a cross-sectional view illustrating the configuration of a semiconductor module to which a lead frame wiring structure in accordance with embodiments has been applied.

The following describes the configuration of a semiconductor module in accordance with embodiments by referring to the drawings. FIG. 1 is a cross-sectional view illustrating the configuration of a semiconductor module 1 to which a lead frame wiring structure in accordance with embodiments has been applied. For descriptive purposes, descriptions are given hereinafter on the assumption that the up-down direction and left-right direction indicated in FIG. 1 are the up-down direction and left-right direction of the semiconductor module 1. However, the up-down direction herein is not necessarily limited to the gravity direction.

As depicted in FIG. 1, the semiconductor module 1 includes an insulated substrate 3 having upper and lower surfaces on which electrode patterns 2 (2a-2c) are provided. Electrode patterns 2a and 2b spaced apart from each other are provided on the upper surface of the insulated substrate 3. An electrode pattern 2c is provided on the entirety of the lower surface of the insulated substrate 3. For example, the electrode patterns 2a-2c may be formed from metal foil or plates of copper (Cu) or aluminum (Al). The electrode patterns 2 may be provided with a plated layer of nickel (Ni) or the like. Note that the structure formed by providing the electrode patterns 2 on the upper and lower surfaces of the insulated substrate 3 will hereinafter be referred to as a layered substrate 4 for descriptive purposes.

A semiconductor chip 6 is bonded to an upper surface of the electrode pattern 2a via solder 5a. For example, the semiconductor chip 6 may include a switching element such as an insulated gate bipolar transistor (IGBT) or a power metal oxide semiconductor field effect transistor (power MOSFET) or a semiconductor element such as a diode, e.g., a free wheeling diode (FWD). The semiconductor chip 6 may include a semiconductor element such as a reverse conducing IGBT (RC-IGBT) formed by integrating an IGBT with a FWD or a reverse blocking IGBT (RB-IGBT) which has sufficient tolerance to a reverse bias. The semiconductor chip 6 may be formed using a semiconductor substrate of silicon (Si), silicon carbide (SiC), gallium nitride (GaN), or the like.

Lead frame wiring (hereinafter simply referred to as a "lead frame") 7 is bonded to the upper surface of the semiconductor chip 6 and the upper surface of the electrode pattern 2b as wiring for electrical connection. The lead frame 7 is formed by bending a metal plate, extends generally in the left-right direction, and is shaped such that two end portions thereof are bent downward. One bonding part 71 of the lead frame 7 is bonded to the upper surface of the semiconductor chip 6 via solder 5b. Another bonding part 72 of the lead frame 7 is bonded to the upper surface of the electrode pattern 2b via solder 5c. The bonding parts 71 and 72 are coupled by a coupling part 73. Note that the configuration of the lead frame 7 will be described hereinafter. The semiconductor chip 6 forms an example of the semiconductor element. The electrode pattern 2b forms an example of the object to be connected to. The object to which the bonding part 72 is connected to is not limited to the electrode pattern 2b and may include a component such as an external terminal of the semiconductor module 1. The lead frame 7 electrically connects the semiconductor chip 6, which is located on one side thereof (left side in FIG. 1), and the electrode pattern 2b, which is located on the other side thereof (right side in FIG. 1).

A metal substrate 8 is bonded to a lower surface of the electrode pattern 2c via solder 5d. In other words, the layered substrate 4 is bonded to an upper surface of the metal substrate 8 via solder 5d. The metal substrate 8 serves to dissipate heat generated in association with the driving of the semiconductor module 1. The metal substrate 8 may include radiating fins (not illustrated). A member obtained by layering the metal substrate 8, the layered substrate 4, and the semiconductor chip 6 will hereinafter be referred to as a layered assembly 9 for descriptive purposes. A resin case 10 is cemented to the layered assembly 9. For example, the resin case 10 may be cemented to the layered assembly 9 with an adhesive such as silicon.

A metal terminal 11 is buried in a portion of the resin case 10. The metal terminal 11 extends in the up-down direction through the resin case 10. A lower end portion 11a of the metal terminal 11 is exposed within the resin case 10. An upper end portion 11b of the metal terminal 11 protrudes to the outside of the resin case 10. A metal wire 12 is connected between a portion of the metal terminal 11 exposed within the resin case 10 and the upper surface of the semiconductor chip 6. Under a condition in which the components are arranged like this, the resin case 10 is filled with a sealing resin 13 formed from a rigid resin such as an epoxy resin, silicone gel, or the like to protect the semiconductor chip 6 in an insulating manner.

Figure 2:
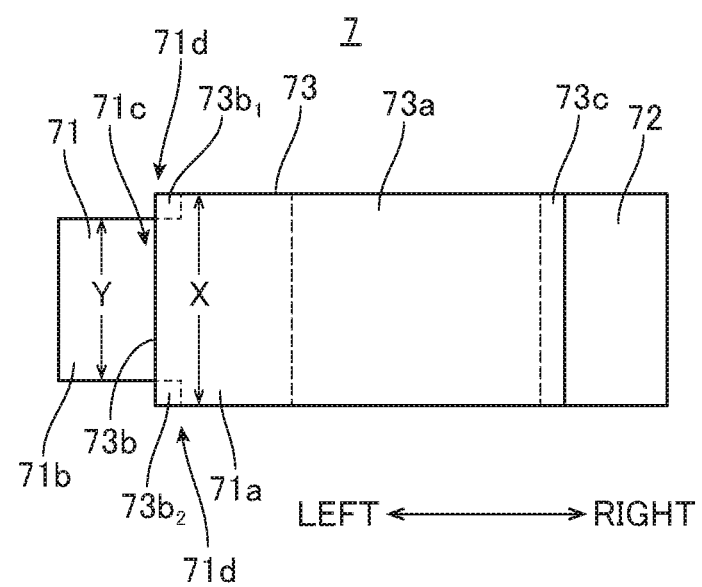
FIG. 2 is a plan view of lead frame wiring in a semiconductor module in accordance with embodiments.
Figure 3:
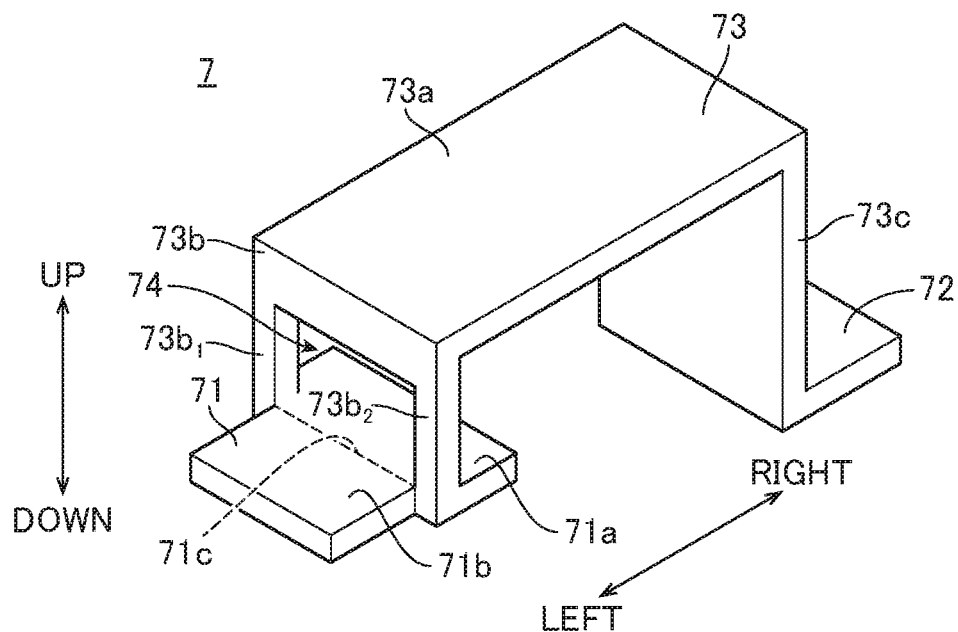
FIG. 3 is a perspective view of lead frame wiring in accordance with embodiments.

Next, descriptions are given of the configuration of the lead frame 7 in the semiconductor module 1 in accordance with embodiments by referring to FIGS. 2 and 3. FIG. 2 is a plan view of the lead frame 7 in the semiconductor module 1 in accordance with embodiments. FIG. 3 is a perspective view of the lead frame 7 in accordance with embodiments. The lead frame 7 is shaped by bending (molding) a metal plate having an equal thickness across the entirety thereof.

As depicted in FIGS. 2 and 3, the lead frame 7 includes bonding parts 71 and 72 having generally planar surfaces and a coupling part 73 coupling the bonding parts 71 and 72. The bonding part 71 forms an example of the first bonding part. The bonding part 72 forms an example of the second bonding part. The coupling part 73 forms an example of the coupling part. The bonding parts 71 and 72 are disposed to be spaced apart from each other in the left-right direction. The bonding parts 71 and 72 and the coupling part 73 may each be substantially shaped like a flat plate. Corners of the bonding parts 71 and 72 may be chamfered.

The bonding part 71 includes a narrow section 71b located on one side thereof (left side in FIG. 2) and a wide section 71a located on the other side thereof (right side in FIG. 2). The wide section 71a has a first width X in a width direction of the metal plate forming the lead frame (up-down direction in FIG. 2). The narrow section 71b has a width Y less than the width of the wide section 71a and protrudes leftward from a side edge portion 71c of the wide section 71a.

The wide section 71a and the narrow section 71b both have a generally rectangular shape when seen in a plan view. For example, the widths of the wide section 71a and the narrow section 71b in the left-right direction may be equal. In this case, the side edge portion 71c is located at a central position between the right and left side end portions of the bonding part 71. When seen in a plan view, the narrow section 71b is located on a central portion of the side edge portion 71c of the wide section 71a (central portion in the up-down direction in FIG. 2). The bonding part 72 has a flat face having an equal width in the up-down direction in FIG. 2. The wide section 71a of the bonding part 71 and the bonding part 72 have the same width as the metal plate forming the lead frame 7 (width X).

The coupling part 73 includes a coupling face section 73a located above the bonding parts 71 and 72 and extending in the left-right direction, a leg section 73b extending from an end portion (one end portion) of the coupling face section 73a on one side (left side in FIG. 2) toward the bonding part 71 (downward), and a leg section 73c extending from an end portion (another end portion) of the coupling face section 73a on another side (right side in FIG. 2) toward the bonding part 72 (downward). The leg section 73b forms an example of the first leg section. The leg section 73c forms an example of the second leg section. In embodiments, the leg section 73c has a greater length than the leg section 73b in the up-down direction. Thus, the bonding part 71 extends in the left-right direction at a position above the bonding part 72.

The leg section 73b is provided with a pair of coupling leg portions $73b_1$ and $73b_2$. The coupling leg portions $73b_1$ and $73b_2$ are located on side end portions of the coupling face section 73a (upper and lower side end portions in FIG. 2). The coupling leg portions $73b_1$ and $73b_2$ are connected to portions of peripheral sections 71d located between an end portion of the bonding part 71 on one side (left side in FIG. 2) (more specifically, the left end portion of the narrow section 71b) and an end portion of the bonding part 71 on another side (right side in FIG. 2) (more specifically, the right end portion of the wide section 71a). The peripheral sections 71d located between one and the other end portions of the bonding part 71 refer to the peripheral sections of the bonding part 71 other than the left and right end portions (i.e., the peripheral sections on the upper and lower sides in FIG. 2). More specifically, the coupling leg portions $73b_1$ and $73b_2$ are connected to regions in which the narrow section 71b is not formed and which are located in the vicinity of the side edge portion 71c of the wide section 71a from which the narrow section 71b protrudes. Still more specifically, the coupling leg portions $73b_1$ and $73b_2$ are connected to portions of the wide section 71a that are located outward of the narrow section 71b (upper and lower sides in FIG. 2). An opening 74 is formed between the pair of coupling leg portions $73b_1$ and $73b_2$. The leg section 73c has a planar face having the same width as the planar face section 73a.

Figure 4:
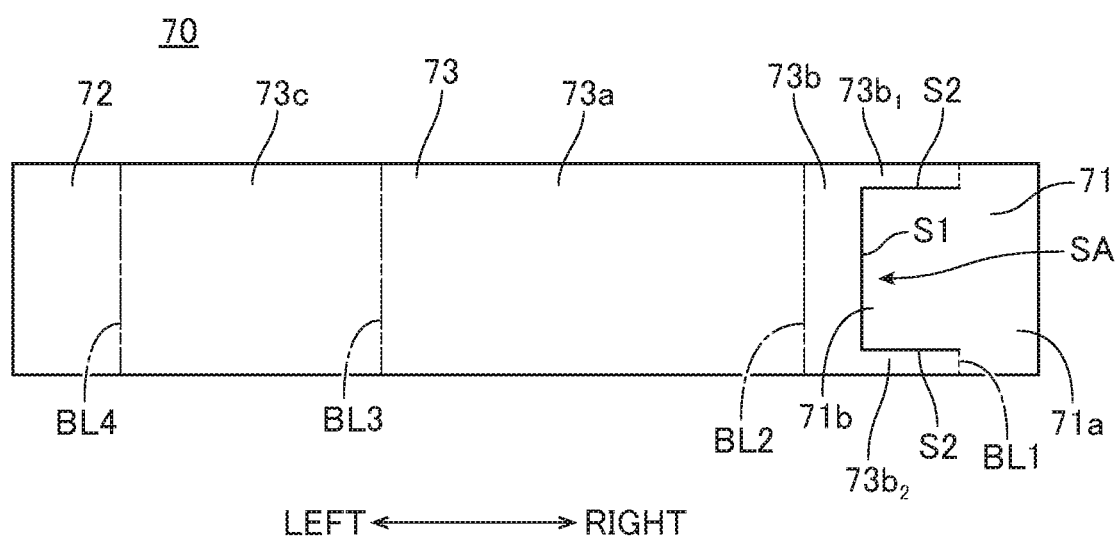
FIG. 4 is a development view of lead frame wiring in accordance with embodiments before processing.
Figure 5A:
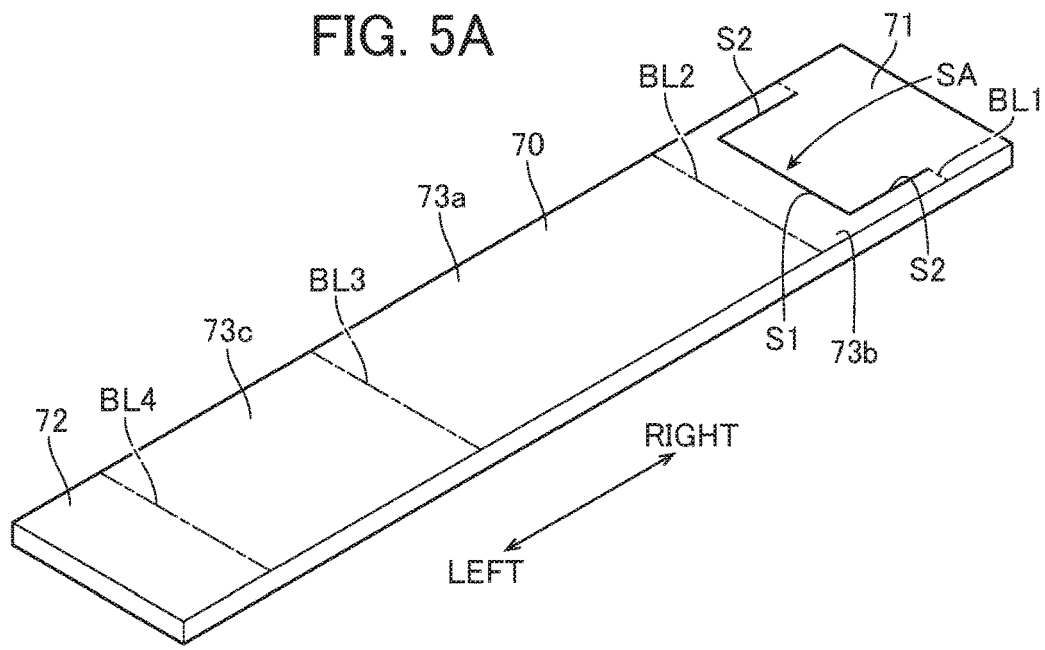
FIGS. 5A and 5B illustrate perspective views of lead frame wiring in accordance with embodiments in a state of being processed.

The following describes the states of the lead frame 7 having the above-described configuration for individual processing steps by referring to FIGS. 4-6. FIG. 4 is a development view of the lead frame 7 in accordance with embodiments before processing. FIGS. 5 and 6 illustrate perspective views of the lead frame 7 in accordance with embodiments in a state of being processed. Note that FIGS. 4-6 indicate the up-down direction and the left-right direction of the semiconductor module 1 depicted in FIG. 1. As depicted in FIGS. 4 and 5A, a metal plate 70 forming the lead frame 7 before processing has a substantially rectangular shape having a longitudinal direction in the left-right direction when seen in a plan view.

A slit SA is formed in an end portion of the metal plate 70 on the right side in FIG. 4. The slit SA is formed perpendicular to the plate surfaces of the metal plate 70 and through the metal plate 70. When seen in a plan view, the slit SA includes a first slit S1 extending in a direction parallel to an end face of the metal plate 70 (up-down direction in FIG. 4) and a pair of second slits S2 extending from two end portions of the first slit S1 toward the right side in FIG. 4. When seen in a plan view, the slit SA has overall a U-shape having an opening on the right side in FIG. 4. The first slit S1 extends on a central portion of the metal plate 70 depicted in FIG. 4. The second slits S2 are formed at positions slightly inward of end faces of the metal plate 70 (end faces in the up-down direction in FIG. 4) and extend parallel to each other. Chamfers may be provided on corners of the metal plate 70 and the slit SA.

In FIGS. 4-6, a first processing line BL1 to a fourth processing line BL4 are indicated for descriptive purposes on portions of the metal plate 70 to be bent. The first processing line BL1 is positioned in the vicinity of the right side end portions of the second slits S2 and outward of the second slits S2 (upper and lower sides in FIG. 4). The second processing line BL2 is positioned slightly leftward of the first slit S1. The third processing line BL3 is positioned slightly leftward of the center of the metal plate 70. The fourth processing line BL4 is positioned close to the left side end portion of the metal plate 70 in FIG. 4. All of the first processing line BL1 to the fourth processing line BL4 extend parallel to the end faces of the metal plate 70 arranged in the left-right direction.

FIGS. 4 and 5A indicate symbols for components of the lead frame 7 after bending for descriptive purposes. As depicted in FIGS. 4 and 5A, the bonding part 71 is formed at a position rightward of the slit SA and the first processing line BL1, and the leg section 73b of the coupling part 73 is formed between the second processing line BL2 and the first processing line BL1 and slit SA. The coupling face section 73a of the coupling part 73 is formed between the second processing line BL2 and the third processing line BL3. The leg section 73c of the coupling part 73 is formed between the third processing line BL3 and the fourth processing line BL4. The bonding part 72 is formed at a position leftward of the fourth processing line BL4.

Figure 5B:
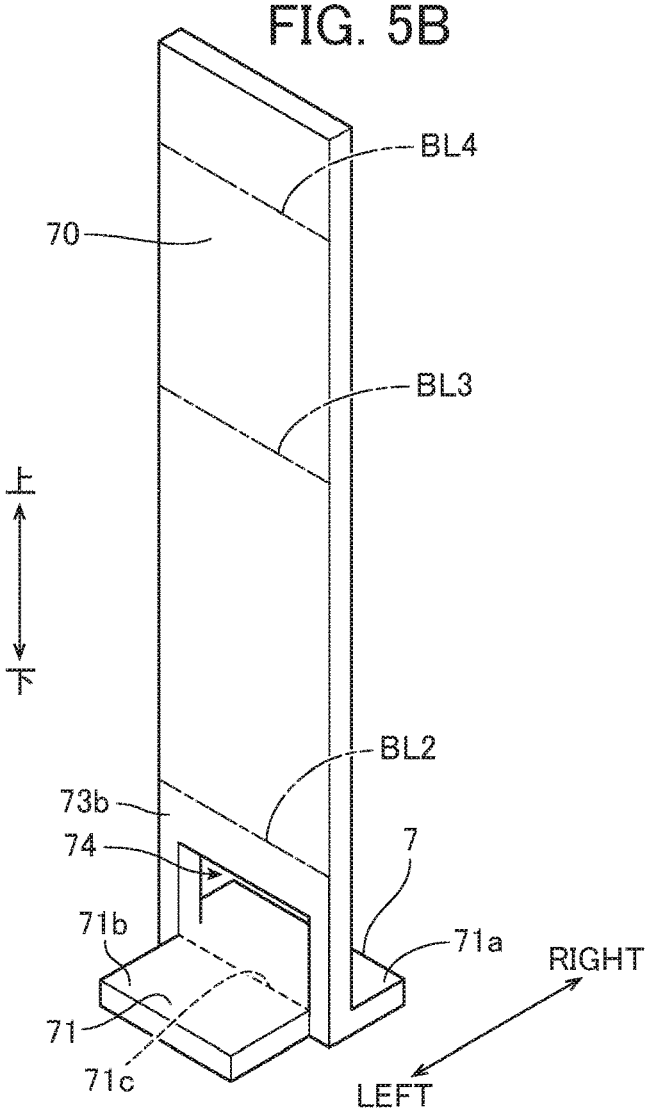

When processing the lead frame 7, first, the portion of the metal plate 70 leftward of the slit SA is bent upward at the first processing line BL1. As depicted in FIG. 5B, the metal plate 70 is bent to be perpendicular to the portion that does not undergo the processing. Bending the metal plate 70 like this forms the bonding part 71, the leg section 73b of the coupling part 73, and the opening 74.

In this case, a portion of the metal plate 70 located inside the slit SA forms the narrow section 71b of the bonding part 71. A portion of the metal plate 70 rightward of the first processing line BL1 forms the wide section 71a of the bonding part 71. A portion of the wide section 71a along the first processing line BL1 forms the side edge portion 71c from which the narrow section 71b protrudes. The leg section 73b of the coupling part 73 coupled to the bonding part 71 is formed through the bending within regions which are in the vicinity of the side edge portion 71c and in which the narrow section 71b is not formed (regions without the narrow section 71b).

Figure 6A:
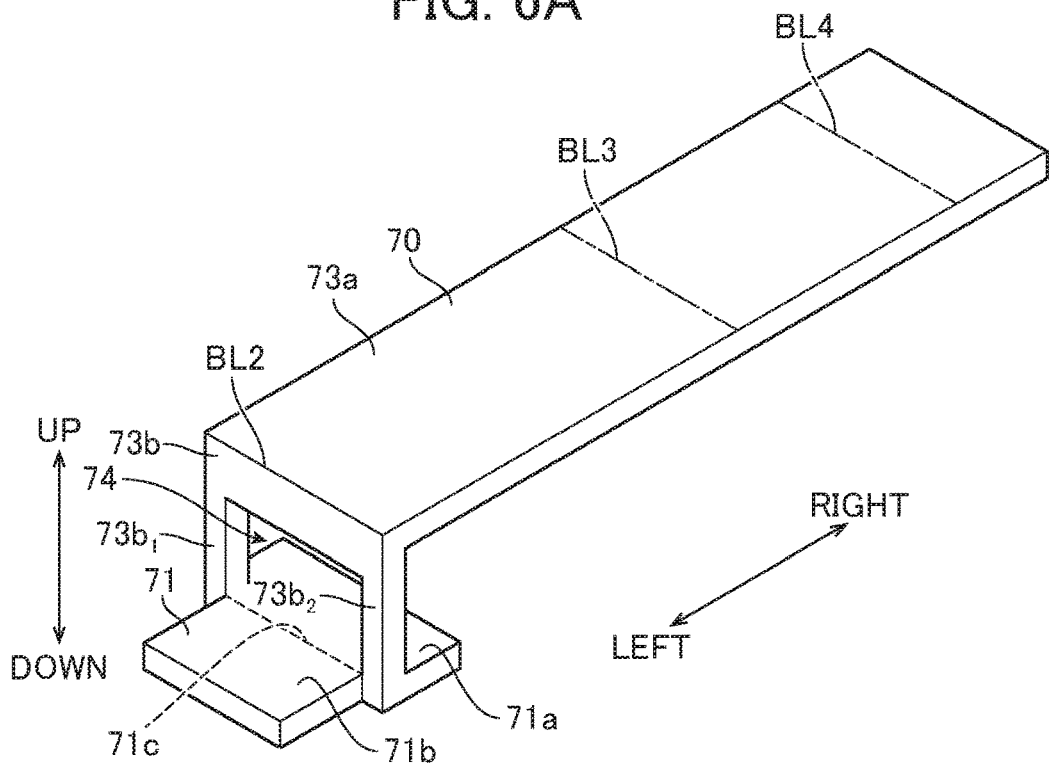
FIGS. 6A and 6B illustrate perspective views of lead frame wiring in accordance with embodiments in a state of being processed.

Next, the portion of the metal plate 70 upward of the second processing line BL2 is bent downward right at the second processing line BL2. As depicted in FIG. 6A, the portion of the metal plate 70 upward of the second processing line BL2 is bent to be parallel to the bonding part 71. Bending the metal plate 70 like this forms the coupling face section 73a of the coupling part 73.

Figure 6B:
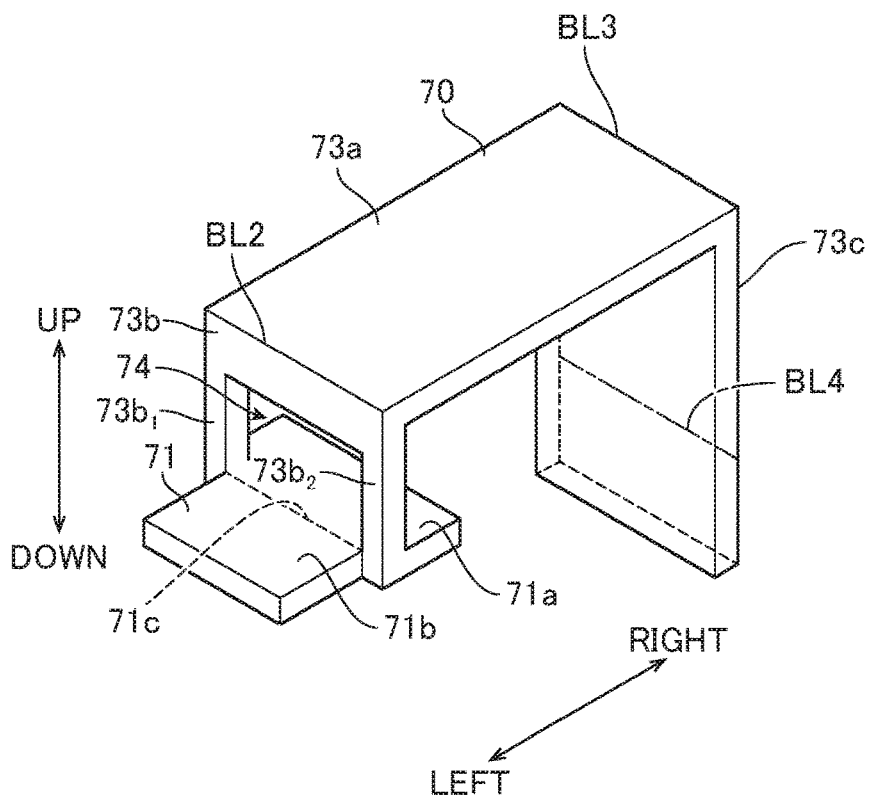

Next, the portion of the metal plate 70 rightward of the third processing line BL3 is bent downward at the third processing line BL3. As depicted in FIG. 6B, the portion of the metal plate 70 rightward of the third processing line BL3 is bent to be parallel to the direction in which the pair of leg sections 73b extend. Bending the metal plate 70 like this forms the leg section 73c of the coupling part 73.

Finally, the portion of the metal plate 70 downward of the fourth processing line BL4 is bent upward at the fourth processing line BL4. As depicted in FIG. 3, the portion of the metal plate 70 downward of the fourth processing line BL4 is bent to be parallel to the bonding part 71. Bending the metal plate 70 like this forms the bonding part 72. In this way, the lead frame 7 depicted in FIG. 3 is completed.

Figure 7A:
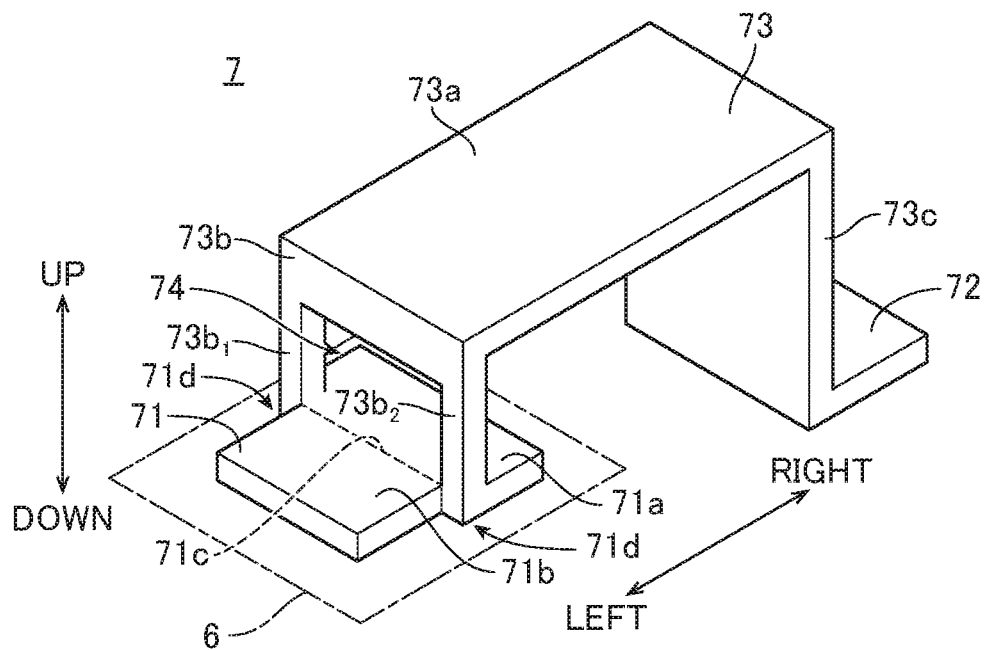
FIGS. 7A and 7B illustrate explanatory diagrams for the positional relationship between a semiconductor chip and lead frame wiring in accordance with embodiments.
Figure 7B:
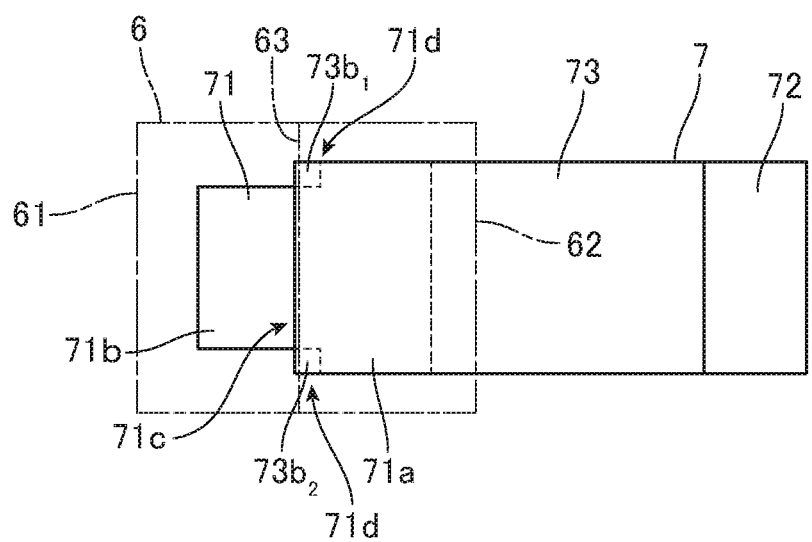

The lead frame 7 formed as described above is soldered to the upper surfaces of the semiconductor chip 6 and the electrode pattern 2b. Next, descriptions are given of the positional relationship of the lead frame 7 with the semiconductor chip 6 by referring to FIGS. 7A and 7B. FIGS. 7A and 7B illustrate explanatory diagrams for the positional relationship between the lead frame 7 in accordance with embodiments and the semiconductor chip 6. FIGS. 7A and 7B respectively illustrate a perspective view and a plan view of the lead frame 7. In FIGS. 7A and 7B, the perimeter of the semiconductor chip 6 is indicated using an alternate long and short dash line for descriptive purposes.

In embodiments, as depicted in FIGS. 7A and 7B, the bonding part 71 of the lead frame 7 is soldered to the upper surface of the semiconductor chip 6 such that the bonding part 71 is located within a central region on the semiconductor chip 6. More specifically, the lead frame 7 is bonded to the semiconductor chip 6 such that the pair of coupling leg portions $73b_1$ and $73b_2$ are disposed at positions including a central position 63 between a left side end portion 61 and a right side end portion 62 of the semiconductor chip 6 (see FIG. 7B).

As depicted in FIG. 7A, the lead frame 7 is such that the leg section 73b (the pair of coupling leg portions $73b_1$ and $73b_2$) of the coupling part 73 is connected to portions of the peripheral sections 71d located between the left and right side end portions of the bonding part 71. Hence, the area of contact between the leg section 73b (the pair of coupling leg portions $73b_1$ and $73b_2$) and the solder for bonding the bonding part 71 to the semiconductor chip 6 can be reduced. Accordingly, when the leg section 73b is formed by bending, the surface area of the R-shaped portion formed in association with the bending can be reduced so that the solder rising phenomenon can be suppressed from occurring, thereby reducing stress concentration on the semiconductor chip.

More specifically, the lead frame 7 is such that only the lower end portions of the leg section 73b (the pair of coupling leg portions $73b_1$ and $73b_2$) of the coupling part 73 (more specifically, the left side faces of the lower end portions of the pair of coupling leg portions $73b_1$ and $73b_2$) have an R shape which could be a cause of the solder rising phenomenon. Accordingly, the surface area of the R-shaped portion can be significantly reduced in comparison to when an R-shaped portion is provided on the entirety of the bonding part 71 in the width direction, so that the solder rising phenomenon can be suppressed from occurring, thereby reducing stress concentration on the semiconductor chip 6.

In particular, the lead frame 7 in accordance with embodiments is such that the leg section 73b (the pair of coupling leg portions $73b_1$ and $73b_2$) of the coupling part 73 is disposed at a position including the central position 63 between the left side end portion 61 and the right side end portion 62 of the semiconductor chip 6. As a general rule, the semiconductor chip 6 is easily broken due to pressure application on the edge portions or in the vicinity thereof. By contrast, the lead frame 7 in accordance with embodiments is such that the leg section 73b (the pair of coupling leg portions $73b_1$ and $73b_2$) is located at a position including the central position 63 on the semiconductor chip 6 in the left-right direction. Hence, when a stress is concentrated on the pair of coupling leg portions $73b_1$ and $73b_2$ or in the vicinities thereof, stress concentration occurs at, or in the vicinity of, the center of the semiconductor chip 6, so that the semiconductor chip 6 can be made less likely to be broken.

The lead frame 7 in accordance with embodiments is such that the pair of coupling leg portions $73b_1$ and $73b_2$ extend from the left side end portion of the coupling face section $73a$ and are connected to the peripheral sections $71d$ of the bonding part 71 that are opposite to the pair of coupling leg portions $73b_1$ and $73b_2$. Thus, when a stress is concentrated on the the pair of coupling leg portions $73b_1$ and $73b_2$ or in the vicinities thereof, the stress concentrated sites are spaced apart from each other (positions spaced apart from each other in the up-down direction in FIG. 7B), thereby making the semiconductor chip 6 less affected by the stress concentration.

The lead frame 7 in accordance with embodiments is such that the leg section $73b$ (the pair of coupling leg portions $73b_1$ and $73b_2$) is formed by bending a portion of the metal plate 70 in the vicinity of the slit SA formed in the metal plate 70 (see FIGS. 5A and 5B). Thus, the surface area of the R-shaped portion to be formed in association with the bending can be easily reduced without the need for a complicated configuration.

In addition, the lead frame 7 in accordance with embodiments is such that the leg section $73b$ (the pair of coupling leg portions $73b_1$ and $73b_2$) of the coupling part is located at a position including the central position between the left and right side end portions of the bonding part 71 (including the side edge portion $71c$ of the wide section $71a$) (see FIG. 7B). Hence, a load generated when bonding the lead frame 7 can be received on the center of the bonding part 71 or in the vicinity thereof via the leg section $73b$, so that the bonding part 71 can be bonded to the semiconductor chip 6 in a balanced manner.

The present invention is not limited to the embodiments described above and can be implemented with various changes made thereto. The above-described embodiments are not limited to the sizes, shapes, functions, or the like of the components illustrated in the attached drawings and can have changes made thereto, as appropriate, as long as the effect of the invention can be achieved. In addition, the invention can be implemented with changes made thereto, as appropriate, without departing from the scope of the purpose of the invention.

Figure 8A:
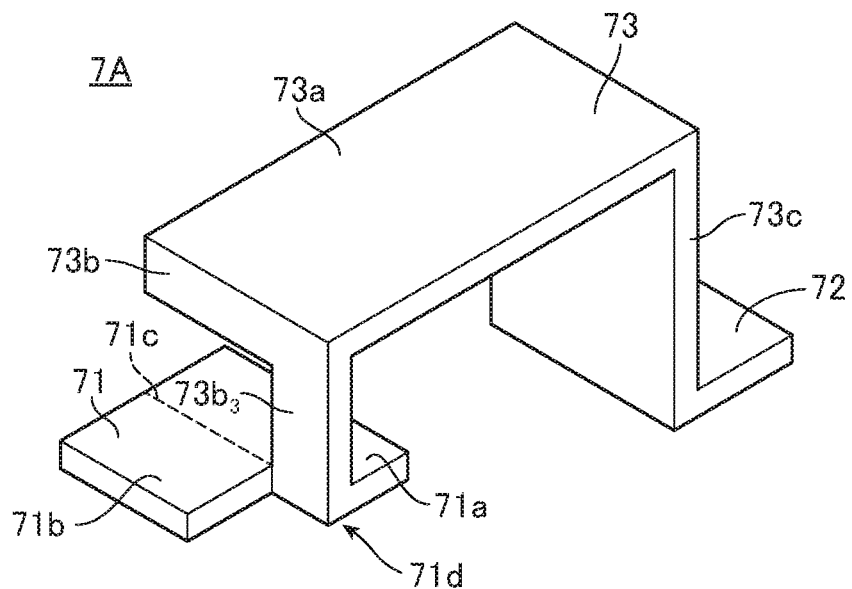
FIGS. 8A and 8B illustrate a perspective view of lead frame wiring in accordance with variations of embodiments and a development view of the lead frame wiring before processing.
Figure 8B:
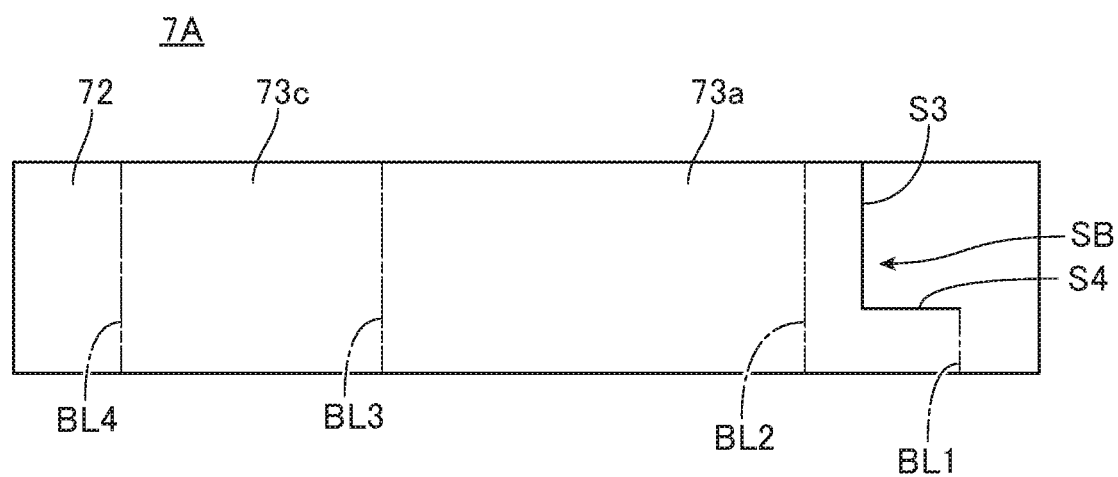

The above-indicated embodiments have been described by referring to the situation in which the metal plate 70 for forming the lead frame 7 is provided with the slit SA and the pair of lead sections $73b$. However, the configuration of the lead frame 7 is not limited to this and can be changed, as appropriate. FIGS. 8A and 8B illustrate a perspective view of a lead frame 7A in accordance with variations of embodiments (FIG. 8A) and a development view of the lead frame 7A before processing (FIG. 8B). Like components depicted in FIGS. 8A and 8B are given like reference marks to those in the above-indicated embodiments, and descriptions thereof are omitted herein.

As indicated in FIG. 8B, the lead frame 7A in accordance with variations is different from the lead frame 7 in that a slit SB is formed in the metal plate 70. The slit SB is formed perpendicular to the plate surfaces of the metal plate 70 and through the metal plate 70. When seen in a plan view, the slit SB includes a third slit S3 extending in a direction parallel to an end face of the metal plate 70 (up-down direction in FIG. 8B) and a fourth slit S4 extending from the lower end portion of the third slit S3 in FIG. 8B toward the right side. The third slit S3 extends from the upper end portion of the metal plate 70 in FIG. 8B to a position slightly downward of the center of the metal plate 70. The fourth slit S4 extends in the longitudinal direction of the metal plate 70.

The metal plate 70 configured as described above is bent in a similar manner to the above-described embodiments so as to form the lead frame 7A depicted in FIG. 8A. The lead frame 7A is different from the lead frame 7 in accordance with the above-described embodiments in that the leg section $73b$ of the coupling part 73 connected to the bonding part 71 includes a single coupling leg portion $73b_3$. The coupling leg portion $73b_3$ is configured to be wider than the coupling leg portion $73b_1$ or $73b_2$. As with the pair of coupling leg portions $73b_1$ and $73b_2$, the coupling leg portion $73b_3$ is connected to a portion of the peripheral section $71d$ located between the left and right side end portions of the bonding part 71.

The lead frame 7A having the above-described configuration is also such that only the lower end portion of the leg section $73b$ (coupling leg portion $73b_3$) of the coupling part 73 has an R shape which could be a cause of the solder rising phenomenon. Accordingly, the surface area of the R-shaped portion can be significantly reduced in comparison to when an R-shaped portion is provided on the entirety of the bonding part 71 in the width direction, so that the solder rising phenomenon can be suppressed from occurring, thereby reducing stress concentration on the semiconductor chip 6.

Figure 9A:
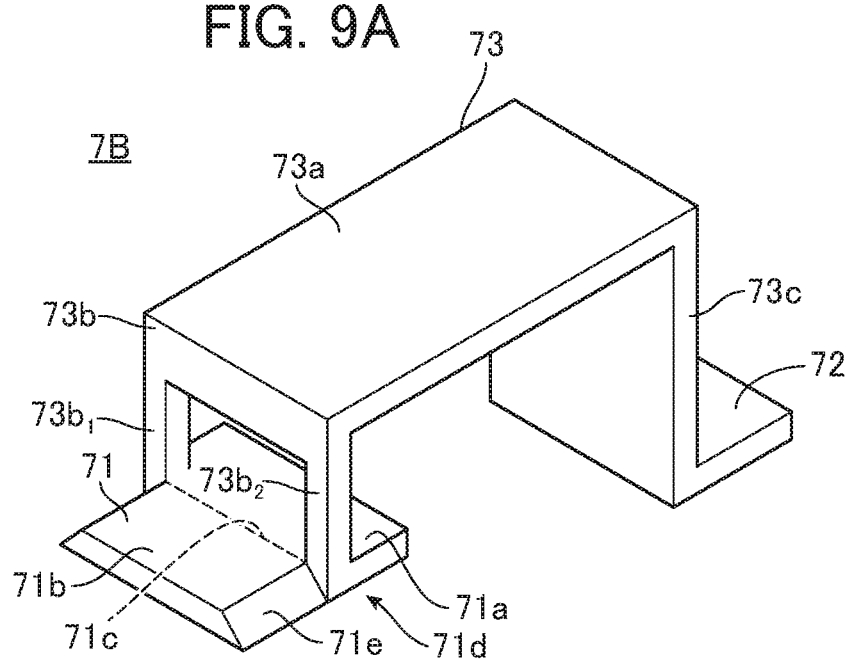
FIGS. 9A and 9B illustrate a perspective view of lead frame wiring in accordance with variations of embodiments and a development view of the lead frame wiring before processing.
Figure 9B:
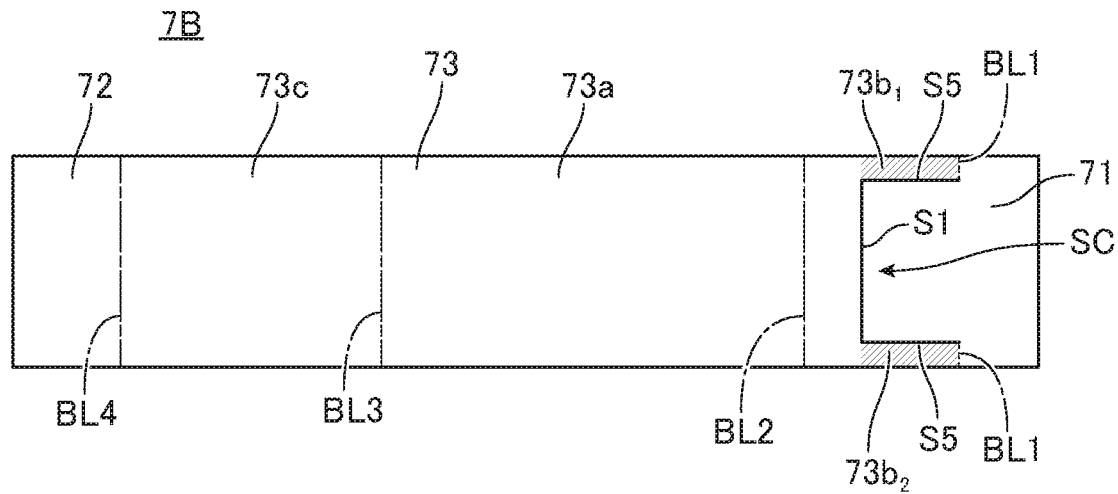

The above-indicated embodiments have been described by referring to the situation in which the lead frame 7 is provided with the slit SA perpendicular to the plate surfaces of the metal plate 70 forming the lead frame 7. However, the configuration of the lead frame 7 is not limited to this and can be changed, as appropriate. FIGS. 9A and 9B illustrate a perspective view of a lead frame 7B in accordance with variations of embodiments (FIG. 9A) and a development view of the lead frame 7B before processing (FIG. 9B). Like components depicted in FIGS. 9A and 9B are given like reference marks to those in the above-indicated embodiments, and descriptions thereof are omitted herein.

As indicated in FIG. 9B, the lead frame 7B in accordance with variations is different from the lead frame 7 in that a slit SC is formed in the metal plate 70. The slit SC is different from the slit SA in that the slit SC includes fifth slits S5 extending from two end portions of the first slit S1 and having an inclined shape, not perpendicular to the plate surfaces of the metal plate 70. The fifth slits S5 of the slit SC are formed like notches extending toward the upper and lower end portions of the metal plate 70 depicted in FIG. 9B.

The metal plate 70 configured as described above is bent in a similar manner to the above-described embodiments so as to form the lead frame 7B depicted in FIG. 9A. The lead frame 7B is different from the lead frame 7 in accordance with the above-described embodiments in that inclined face sections $71e$ are formed on side edge portions of the narrow section $71b$ of the bonding part 71. The inclined face sections $71e$ are each formed outward of the narrow section $71b$ in such a manner as to increase the widthwise size downward. The inclined face sections $71e$ form an example of a restriction section that restricts contact between the pair of coupling leg portions $73b_1$ and $73b_2$ and the solder for bonding the bonding part 71.

The lead frame 7B having the above-described configuration is such that the bonding part 71 includes the inclined face sections $71e$ formed outward of the narrow section $71b$ in such a manner as to increase the widthwise size downward. Thus, the solder is restricted from coming into contact with the left side faces of the pair of coupling leg portions $73b_1$ and $73b_2$, so that the solder rising phenomenon on the left side end faces of the pair of coupling leg portions $73b_1$ and $73b_2$ can be suppressed from occurring, thereby reducing stress concentration on the semiconductor chip 6 effectively.

Descriptions have been give by referring to the situation in which the lower side end portions of the inclined face sections 71e are located at the same position as an end face of the wide section 71a (the end face in the up-down direction in FIG. 9B). However, the positions of the lower side end portions of the inclined face sections 71e are not limited to this. The lower side end portions of the inclined face sections 71e can be located at any position outward of the position of the upper end portion of the narrow section 71b (the up-down direction in FIG. 9B).

The following are an overview of features in the embodiments described above.

The lead frame wiring structure in accordance with the above-described embodiments electrically connects a semiconductor element to an object to be connected to, the lead frame wiring including a first bonding part soldered to the semiconductor element, a second bonding part positioned spaced apart from the first bonding part and soldered to the object, and a coupling part coupling the first and second bonding parts, wherein the coupling part includes a coupling face section positioned spaced apart from the first and second bonding parts in an up-down direction, a first leg section extending from an end portion of the coupling face section on one side toward the first bonding part, and a second leg section extending from an end portion of the coupling face section on another side toward the second bonding part, and the first leg section is connected to a portion of a peripheral section of the first bonding part that is located between an end portion of the first bonding part on the one side and an end portion thereof on the other side. In this configuration, the first leg section is connected to a portion of the peripheral section of the first bonding part that is located between the end portion of the first bonding part on the one side and the end portion thereof on the other side. Hence, the area of contact between the first leg section and the solder for bonding the first bonding part to the semiconductor element can be reduced. Accordingly, when the first leg section is formed by bending, the surface area of the R-shaped portion formed in association with the bending can be reduced so that the solder rising phenomenon can be suppressed from occurring, thereby reducing stress concentration on the semiconductor chip.

The lead frame wiring structure in accordance with the above-described embodiments is such that the first leg section is located at a position including a central position between the end portion of the first bonding part on the one side and the end portion thereof on the other side. In this configuration, the first leg section is located at a position including a central position between the end portion of the first bonding part on the one side and the end portion thereof on the other side, so that a load generated when bonding the lead frame wiring can be received on the center of the first bonding part or in the vicinity thereof via the first leg section, thereby allowing the first bonding part to be bonded to the semiconductor element in a balanced manner.

The lead frame wiring structure in accordance with the above-described embodiments is such that the first leg section is formed by bending a portion of a metal plate forming the lead frame wiring that is in the vicinity of a slit formed in the metal plate. In this configuration, the first leg section is formed by bending a portion of the metal plate that is in the vicinity of a slit formed in the metal plate, and hence the surface area of the R-shaped portion to be formed in association with the bending can be easily reduced without the need for a complicated configuration.

The lead frame wiring structure in accordance with the above-described embodiments is such that the first leg section is located at a position including a central position between an end portion of the semiconductor element on the one side and an end portion thereof on the other side with the first bonding part connected to the semiconductor element. In this configuration, the first leg section is located at a position including a central position between the end portion of the semiconductor element on the one side and the end portion thereof on the other side. Hence, when a stress is concentrated on the first leg section or in the vicinity thereof, stress concentration occurs at, or in the vicinity of, the center of the semiconductor element, not on the edge portions of the semiconductor element or in the vicinity thereof, thereby making the semiconductor element less likely to be broken.

The lead frame wiring structure in accordance with the above-described embodiments is such that a pair of said first leg sections extend from the end portion of the coupling face section on the one side toward the first bonding part and are connected to peripheral sections of the first bonding part that are opposite to the pair of first leg sections. In this configuration, the pair of first leg sections are connected to peripheral sections of the first bonding part that are opposite to the pair of first leg sections. Thus, when a stress is concentrated on the first leg sections or in the vicinities thereof, the stress concentrated sites are spaced apart from each other, thereby making the semiconductor element less affected by the stress concentration.

The lead frame wiring structure in accordance with the above-described embodiments is such that the first bonding part includes a restriction section that restricts solder from coming into contact with a face of the first leg section on the one side. In this configuration, the solder is restricted from coming into contact with the face of the first leg section on the one side, so that the solder rising phenomenon on the face of the first leg section on the one side can be suppressed from occurring, thereby reducing stress concentration on the semiconductor chip effectively.

The semiconductor module in accordance with the above-described embodiments includes any of the abovementioned lead frame wiring structures. In this configuration, the semiconductor module can achieve the effects that can be attained by the lead frame wiring structures described above.

INDUSTRIAL APPLICABILITY

The semiconductor module of the present invention has the effect of reducing stress concentration on a semiconductor chip and is preferable for a semiconductor module required to be reduced in size and weight and attain a long-term reliability under high-temperature operating environment, such as a semiconductor module used for a vehicle-mounted-motor drive control inverter.

The present application is based upon Japanese Patent Application No. 2018-208087, filed on Nov. 5, 2018, the entire contents of which are incorporated herein.

The invention claimed is:

1. A lead frame wiring structure for a semiconductor module including a semiconductor element and an object, for electrically connecting the semiconductor element to the object, the lead frame wiring structure comprising:
 a first bonding part, to be soldered to the semiconductor element;
 a second bonding part positioned apart from the first bonding part, to be soldered to the object; and a coupling part extending in a first direction between the first and second bonding parts, to couple the first and second bonding parts, wherein the coupling part includes
- a coupling face section having opposite first and second end portions thereof in the first direction,
- a first leg section extending from the first end portion of the coupling face section toward the first bonding part, and
- a second leg section extending from the second end portion of the coupling face section toward the second bonding part;

the first bonding part includes a wide section and a narrow section, the narrow section being narrower than the wide section in a second direction perpendicular to the first direction, wherein
- the wide section has a side edge portion, and a peripheral section adjacent to the side edge portion in the second direction, and
- the narrow section protrudes in the first direction from the side edge portion of the wide section; and in the coupling part,
- the coupling face section is spaced apart from the first and second bonding parts in a third direction perpendicular to both the first direction and the second direction, and
- the first leg section is connected to a portion of the peripheral section of the first bonding part.

2. The lead frame wiring structure of claim 1, wherein said portion to which the first leg section of the coupling part is connected is at a central position of the first bonding part in the first direction.

3. The lead frame wiring structure of claim 1, wherein the lead frame wiring structure is made of a metal plate having a slit, and
the first leg section of the coupling part is formed by bending a portion of the metal plate in a vicinity of the slit.

4. The lead frame wiring structure of claim 1, wherein said portion to which the first leg section of the coupling part is connected is at a central position between two end portions of the semiconductor element in the first direction.

5. The lead frame wiring structure of claim 1, wherein said first leg section includes a pair of first leg sections that extend from the first end portion of the coupling face section toward the first bonding part,
said peripheral section includes two peripheral sections that are adjacent to, and on opposite sides of, the side edge portion in the second direction, and
the pair of first leg sections are respectively connected to the two peripheral sections of the first bonding part.

6. The lead frame wiring structure of claim 1, wherein the first bonding part includes a restriction section configured to restrict contact between the first leg section and solder.

7. A semiconductor module comprising the lead frame wiring structure of claim 1.

* * * * *